US009394163B2

(12) United States Patent
Binninger et al.

(10) Patent No.: US 9,394,163 B2
(45) Date of Patent: Jul. 19, 2016

(54) METHOD FOR PRODUCING A DIELECTRIC LAYER ON A COMPONENT

(75) Inventors: Charles Binninger, Munich (DE); Christoph Eggs, Rattenkirchen (DE); Bruno Fuerbacher, Ingolstadt (DE); Ulrich Knauer, Munich (DE); Manfred Maisch, Unterhaching (DE); Helmut Zottl, Munich (DE)

(73) Assignee: EPCOS AG, Munich (DE)

( * ) Notice: Subject to any disclaimer, the term of this patent is extended or adjusted under 35 U.S.C. 154(b) by 216 days.

(21) Appl. No.: 13/639,527

(22) PCT Filed: Apr. 13, 2011

(86) PCT No.: PCT/EP2011/055850
§ 371 (c)(1),
(2), (4) Date: Dec. 17, 2012

(87) PCT Pub. No.: WO2011/128387
PCT Pub. Date: Oct. 20, 2011

(65) Prior Publication Data
US 2013/0126466 A1    May 23, 2013

(30) Foreign Application Priority Data
Apr. 14, 2010 (DE) .......................... 10 2010 014 919

(51) Int. Cl.
| C25F 3/00 | (2006.01) |
| B81C 1/00 | (2006.01) |
| H03H 3/10 | (2006.01) |
| H03H 9/02 | (2006.01) |

(52) U.S. Cl.
CPC ............. *B81C 1/00396* (2013.01); *H03H 3/10* (2013.01); *H03H 9/02834* (2013.01)

(58) Field of Classification Search
None
See application file for complete search history.

(56) References Cited

U.S. PATENT DOCUMENTS

| 5,350,486 A | 9/1994 | Huang |
| 5,384,288 A | 1/1995 | Ying |
| 5,516,625 A | 5/1996 | McNamara et al. |
| 5,665,657 A | 9/1997 | Lee |
| 5,679,211 A | 10/1997 | Huang |

(Continued)

FOREIGN PATENT DOCUMENTS

| DE | 10 2006 053 472 A1 | 5/2008 |
| EP | 0 734 120 A1 | 9/1996 |

(Continued)

OTHER PUBLICATIONS

Nakai, Y., et al., "Surface Acoustic Wave Duplexer composed of $SiO_2$ film with Convex and Concave on Cu-electrodes/$LiNbO_3$ Structure," Proceedings of the IEEE International Ultrasonics Symposium, Nov. 2-5, 2008, pp. 1580-1583.

(Continued)

*Primary Examiner* — Binh X Tran
*Assistant Examiner* — David Cathey, Jr.
(74) *Attorney, Agent, or Firm* — Slater Matsil, LLP

(57) ABSTRACT

A method for producing a dielectric layer on the surface of a component is described. In particular embodiments, a dielectric layer having a planar surface can be generated over a substrate topography having raised structures. In a trimming process, a component property, which depends on the thickness or the third topography of the dielectric layer, is adjusted.

13 Claims, 4 Drawing Sheets

(56) References Cited

U.S. PATENT DOCUMENTS

| | | | |
|---|---|---|---|
| 5,849,632 A * | 12/1998 | Tuttle et al. | 438/633 |
| 5,923,231 A * | 7/1999 | Ohkubo et al. | 333/193 |
| 6,063,702 A | 5/2000 | Chung | |
| 6,117,798 A | 9/2000 | Fang et al. | |
| 6,836,196 B2 | 12/2004 | Kadota et al. | |
| 6,879,225 B2 | 4/2005 | Kadota et al. | |
| 6,914,498 B2 | 7/2005 | Kadota | |
| 7,034,433 B2 | 4/2006 | Kadota et al. | |
| 7,208,860 B2 | 4/2007 | Kadota et al. | |
| 7,209,018 B2 | 4/2007 | Nakao et al. | |
| 7,327,071 B2 | 2/2008 | Nishiyama et al. | |
| 7,345,400 B2 | 3/2008 | Nakao et al. | |
| 7,411,334 B2 | 8/2008 | Nishiyama et al. | |
| 7,425,788 B2 | 9/2008 | Kadota et al. | |
| 7,453,184 B2 | 11/2008 | Kando | |
| 7,459,991 B2 | 12/2008 | Ruile et al. | |
| 7,564,244 B2 | 7/2009 | Freytag | |
| 7,626,313 B2 | 12/2009 | Yaoi et al. | |
| 7,888,841 B2 | 2/2011 | Kadota et al. | |
| 7,902,718 B2 | 3/2011 | Kadota et al. | |
| 2002/0005676 A1 | 1/2002 | Greer | |
| 2003/0137367 A1 | 7/2003 | Kadota | |
| 2003/0146674 A1 | 8/2003 | Jacot et al. | |
| 2004/0108791 A1 | 6/2004 | Kadota et al. | |
| 2006/0103486 A1 * | 5/2006 | Ruile et al. | 333/133 |
| 2006/0131992 A1 | 6/2006 | Nakao et al. | |
| 2009/0058225 A1 | 3/2009 | Kadota | |
| 2010/0033055 A1 | 2/2010 | Nakatani | |

FOREIGN PATENT DOCUMENTS

| | | |
|---|---|---|
| EP | 1 391 988 A2 | 2/2004 |
| EP | 1 578 015 A1 | 9/2005 |
| JP | 2002353761 A | 12/2002 |
| JP | 2003298375 A | 10/2003 |
| JP | 2003532349 A | 10/2003 |
| JP | 2005354272 A | 12/2005 |
| JP | 2009296265 A | 12/2009 |
| JP | 2010045533 A | 2/2010 |
| WO | 9604713 A1 | 2/1996 |
| WO | WO 2005/036743 A1 | 4/2005 |
| WO | WO 2005/036744 A1 | 4/2005 |
| WO | 2005083881 A1 | 9/2005 |
| WO | WO 2006/011417 A1 | 2/2006 |
| WO | WO 2008/004408 A1 | 1/2008 |
| WO | WO 2008/044411 A1 | 4/2008 |

OTHER PUBLICATIONS

Notification of Reasons for Rejection received in Application No. JP 2013-504268, mailed Nov. 5, 2014, 7 pages.

* cited by examiner

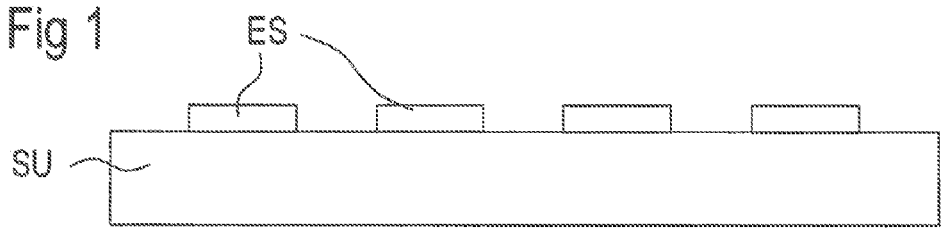
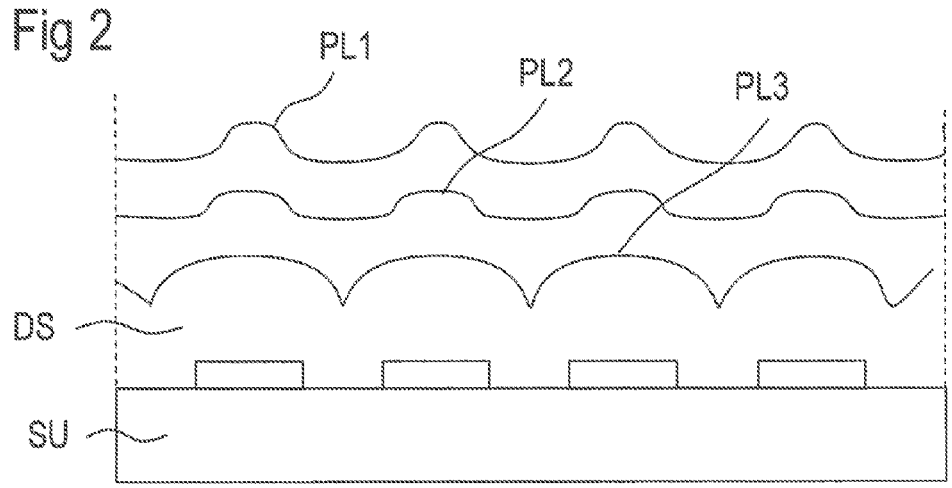
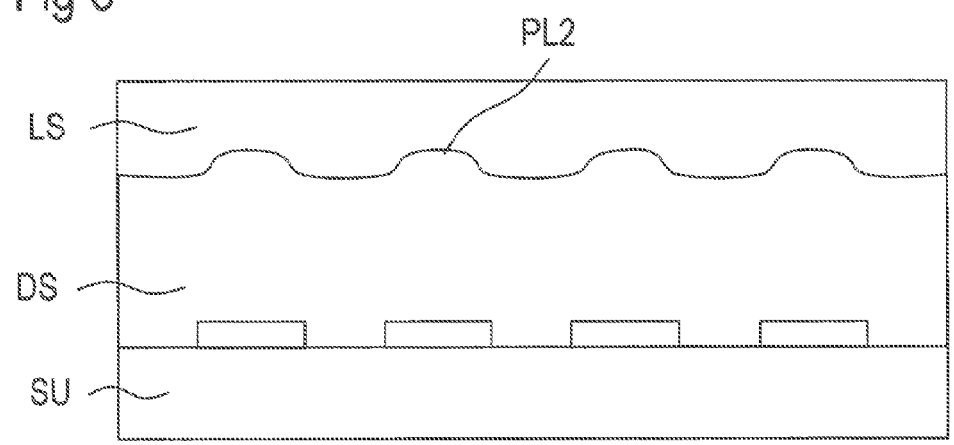

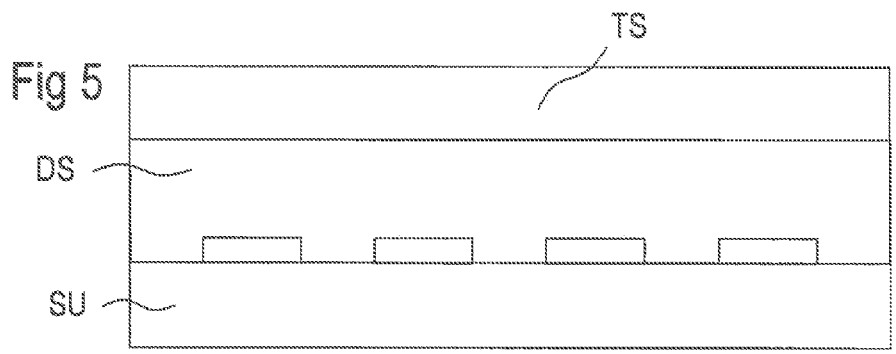
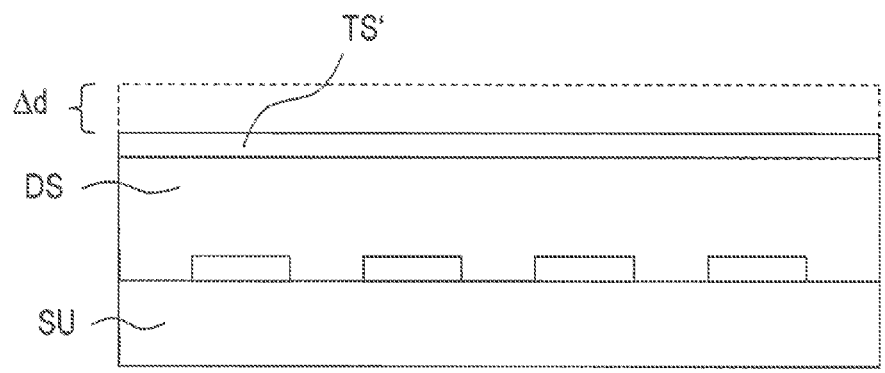
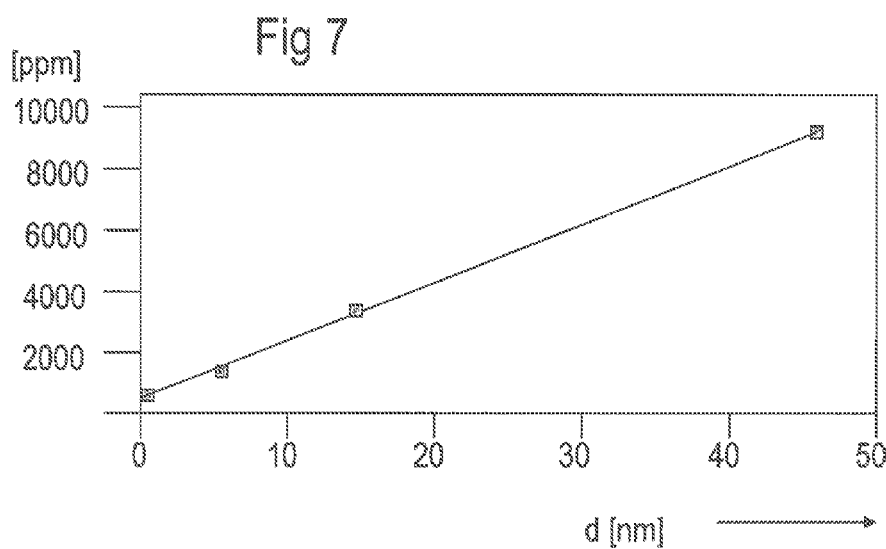

METHOD FOR PRODUCING A DIELECTRIC LAYER ON A COMPONENT

This patent application is a national phase filing under section 371 of PCT/EP2011/055850, filed Apr. 13, 2011, which claims the priority of German patent application 10 2010 014 919.5, filed Apr. 14, 2010, each of which is incorporated herein by reference in its entirety.

TECHNICAL FIELD

The invention relates to a method for producing a dielectric layer on a component.

BACKGROUND

While relatively small layer thicknesses can be reliably reproduced by means of known layer deposition methods by correspondingly setting the parameters, precisely in the case of thick dielectric layers applied over a large area there is the problem that layer thickness fluctuations which exceed the tolerance interval can occur. A desired topography at the surface of the dielectric layer can be a planar surface or a surface having specific structures.

SUMMARY OF THE INVENTION

One specific problem occurs whenever the layer thickness of the dielectric layer has a direct effect on the component properties and, owing to hitherto virtually unavoidable layer thickness fluctuation, the component properties also exhibit deviations to an unacceptable extent.

One specific application requiring thick dielectric layers which are to be applied in part to a topography with elevated structures concerns temperature compensation layers on MEMS components and, in particular, on components which operate with acoustic waves. For this purpose, in particular silicon dioxide layers with a layer thickness which e.g., 30% of the wavelength of the acoustic wave propagating in the substrate are applied directly over the electrodes, thus resulting in a layer thickness of approximately 600 nm, for example, for a component operating at 2 GHz. If this $SiO_2$ layer is applied by means of sputtering, then it is possible, by setting a higher BIAS voltage, to set a certain degree of etching-back which can be used to level the topography that forms at the surface of the $SiO_2$ layer. In this case, however, the problem occurs that although sufficiently planar surface regions of the $SiO_2$ layer can be obtained in a component, the layer thickness, as seen over an entire wafer, fluctuates to such a great extent that the tolerance ranges are nevertheless exceeded.

In one aspect the present invention specifies a method for producing a dielectric layer wherein a desired topography, in particular a planar surface of the dielectric layer, can be obtained.

A method is specified wherein the dielectric layer is firstly applied on the surface of a component having a first topography with elevated structures, in an arbitrary deposition method. The method is set such that the deposition is effected in an edge-covering manner, with the result that no cavities arise in the layer. As a consequence, however, the dielectric layer forms on its surface a topography which traces the elevated structures of the first topography on the component surface on the second topography, with the result that the elevated structures are still visible there and form at least elevations.

In order then to convert said second topography into a desired topography, a specific etching method is used. For this purpose, firstly a polymer layer, e.g., a resist layer, is applied to the dielectric layer over the whole area such that it covers the entire surface of the dielectric layer and forms a planar surface. For this purpose, a resist having a suitable viscosity can be applied to the surface by spin coating, for example.

Afterward, an etching method is carried out. In this case, an etching rate ratio of dielectric layer to the polymer layer is set, with which ratio a desired third topography can be obtained after the etching method.

In one embodiment, an etching rate ratio of approximately 1 is set. This ratio guarantees that the resist layer is etched at the same rate as the dielectric layer. This has the effect that the planar surface that can be set in the case of the polymer layer is maintained throughout etching and is thus transferred to the dielectric layer. Therefore, a planar surface of the dielectric layer can be produced with an etching rate ratio of approximately 1.

In the last step of the method, a component property dependent on the thickness of the dielectric layer or the third topography (=topography of the dielectric layer after etching) is readjusted by means of a trimming method. Therefore, the method is fault-tolerant and reliably leads to a component having clearly defined properties. Deviations particularly in the deposition method which lead to deviations in layer thickness or deviations in third topography can be eliminated by means of the trimming method. Since frequency deviations are corrected in the trimming method, in this way it is also possible to compensate for consequences of other fault sources in the method which lead to an undesirable frequency shift.

In one embodiment, the method is used in the case of a component comprising a piezoelectric substrate or a piezoelectric layer on a substrate. Elevated electrode structures are arranged on the surface of the substrate or on the surface of the piezoelectric layer, said electrode structures together with the rest of the surface forming a first topography. The electrode structures are designed for exciting acoustic waves in the component and constitute, for example, interdigital transducers of SAW components (SAW=Surface Acoustic Wave) or electrodes of BAW components (BAW=Bulk Acoustic Wave). In the case of such components which operate with acoustic waves, with a dielectric layer the temperature dependence of the frequency of the component is influenced and, in particular, reduced by a suitable choice of the material of the dielectric layer.

During the trimming method, a subsequent alteration of the layer thickness deposited over the first topography and thus over the electrodes is performed and the center frequency or the exact position of an edge of the passband of the component is thus readjusted. The center frequency of the component is the frequency in the center of a passband, a resonant frequency of a resonator or some other operating frequency at which the component allows radio-frequency signals to pass.

In order to lower the temperature response of the center frequency, in the case of components operating with acoustic waves, a silicon dioxide layer is applied as dielectric layer. Said silicon dioxide layer exhibits a temperature response having a sign opposite to the sign of the temperature response of the piezoelectric substrate.

In the trimming method, a trimming layer, having a higher stiffness than the dielectric layer, is applied to the third topography. In said layer, the acoustic wave experiences a higher propagation velocity, with the result that the frequency of the component increases. The extent of this increase in frequency is dependent on the thickness of the trimming layer. In order to precisely set or readjust the frequency of the component, the thickness of the trimming layer and thus also the center frequency are subsequently reduced until a predefined center frequency is attained.

The method can comprise, before the trimming method is carried out, determining the component properties to be adjusted. In particular, a measuring method in this case can be used to determine whether a deviation of the center frequency is present. Accordingly, the trimming method can then be carried out such that exactly this deviation is compensated for.

In one embodiment, the method for producing the dielectric layer is carried out such that a center frequency lying below the desired center frequency is obtained after the etching method leading to planarization. This guarantees that all deviations from the desired center frequency can be compensated for by depositing and etching back a trimming layer and the associated increase in the center frequency.

In a further embodiment, all of the method steps are carried out on a wafer which comprises electrode structures of a plurality of components and can be singulated into a multiplicity of individual components in a later method step. In this case, the center frequency of individual components is determined at a method stage between producing the third topography and etching back the trimming layer. This does not necessitate measuring each individual component. It is sufficient to determine the center frequency at specific points that are critical in a manner governed by method and apparatus, and to carry out an interpolation of the center frequency for the remaining components not directly measured, with the result that a measured or interpolated deviation is obtained for each location on the wafer surface or for each of the components.

The trimming method is then carried out such that the thickness of the trimming layer is reduced location-selectively in a manner dependent on the determined or interpolated deviation at the respective location. This makes it possible, in the trimming method, to compensate for all deviations from the desired center frequency, even if they have different extents in a manner distributed over the wafer. The desired center frequency can therefore be set to the desired value either exactly or within a predefined tolerance.

Layers which passivate the oxide layer are particularly suitable as trimming layers. This has the advantage that the trimming layer can also perform the additional function as a passivation layer. In particular hard layers selected from the group of nitrides, oxynitrides, oxides or carbides are suitable for this purpose. Suitable compounds are, for example, silicon nitride, silicon oxynitride, aluminum oxide, DLC (=diamond like carbon) or diamond. All these layers can also be applied in well-controllable processes and primarily with high layer thickness accuracy.

The layer thickness of the trimming layer can be reduced, for example, by means of the scanning action of an ion beam directed onto the surface of the trimming layer. The duration of action of the ion beam on the surface and thus the etching effect are determined depending on the relative speed at which ion beam and wafer are moved in relation to one another. The scanning action of the ion beam can therefore be set such that the etching success sought or the desired reduction of the trimming layer can be effected by speeds in each case adapted differently at different locations of the wafer surface. The scanning method can therefore be set whilst taking account of the determined deviations from the center frequency and exact knowledge of the etching process of the trimming layer. For this purpose, the etching rate that can be achieved with the ion beam is determined in comparative experiments for a given apparatus under given conditions and is used for correspondingly setting the trimming method.

If a third topography that deviates from a planar surface is sought during the etching of the dielectric layer, then the etching rate ratio can also be set to values other than 1. With an etching rate ratio>1 it is possible to use the polymer layer as resist. This has the consequence that the dielectric layer is etched only at the places at which no polymer layer remains. Since the polymer layer usually deposits at the deepest places of the second topography, a topography that is the inverse of the second topography can be obtained in this way. At places at which the second topography has elevations, depressions are produced in the third topography in this way. This has the consequence, however, that, given a suitably set etching rate ratio>1, a planar third topography of the dielectric layer can likewise be obtained, at least approximately and as an intermediate stage. By contrast, an etching rate ratio<1 has little effect and, although it leads to a certain leveling of the third topography relative to the second topography, it cannot lead to a planar surface of the dielectric layer.

BRIEF DESCRIPTION OF THE DRAWINGS

The invention is explained in greater detail below on the basis of exemplary embodiments and the associated figures. The figures serve solely for elucidating the invention and are therefore depicted only schematically and not as true to scale. Individual dimensions may be illustrated in a distorted manner, and so neither absolute nor relative dimensional indications can be gathered from the figures. In the figures:

FIG. 1 shows a substrate, on which elevated structures are arranged, in schematic cross section;

FIG. 2 shows the arrangement after a dielectric layer having different topographies has been deposited thereabove;

FIG. 3 shows the arrangement after a polymer layer has been applied;

FIG. 5 shows the arrangement after a trimming layer has been applied;

FIG. 6 shows the arrangement after trimming;

FIG. 7 shows the dependence of the shift in the center frequency on the thickness of the trimming layer in a diagram.

DETAILED DESCRIPTION OF ILLUSTRATIVE EMBODIMENTS

Figure 4A:
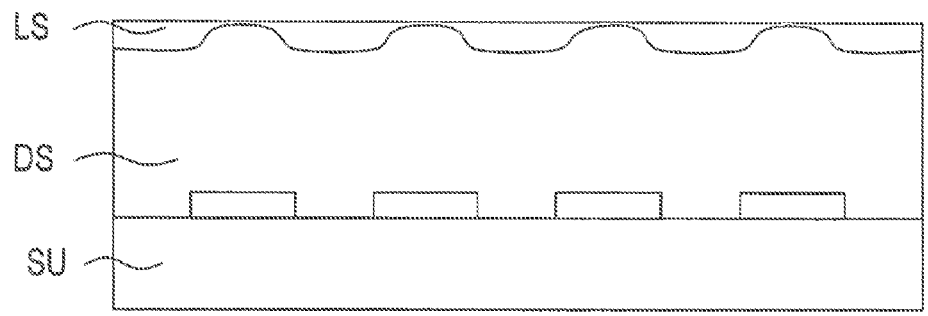
FIGS. 4a to 4c show the arrangement at different method stages during the etching back of the polymer layer.

FIG. 1 shows, in schematic cross section a general illustration of a substrate SU, on which elevated structures ES are arranged. Advantageously, the substrate SU is a piezoelectric substrate and the elevated structures ES are electrode fingers of an interdigital transducer. FIG. 1, therefore, shows an excerpt from a SAW component.

In one embodiment, the elevated structures are composed of a material having a greater hardness or a higher density than pure aluminum. They either comprise an aluminum alloy with a heavy metal or have a single- or multilayered construction comprising partial layers that are heavier than Al and contain copper, for example. A heavy or dense metal for the electrodes or the elevated structures. It is advantageous in order to obtain a better reflection of the acoustic wave at the electrode edges in the later completed SAW component with temperature compensation layer.

A dielectric layer DS is then applied to the arrangement according to FIG. 1. In this case, an $SiO_2$ layer, for example, can be applied by sputtering or by a CVD method, for example. A bias voltage is advantageously set for sputtering. In one embodiment, by way of example, sputtering is effected at a power of 1.5 kW and a bias voltage of 85 W. The sputtering process is set such that the $SiO_2$ layer deposits in an edge-covering manner over the elevated structures ES. As a result, the dielectric layer DS forms a second topography.

FIG. 2 shows different exemplary profile lines PL1 to PL3 forming the second topography, which arose under different sputtering conditions and, in particular, under different bias voltages. The bias voltage decreases from the profile line PL1 toward the profile line PL3. It is evident that a higher bias voltage brings about better leveling of the second topography. What is disadvantageous, however, is that a higher BIAS voltage leads to a layer thickness distribution that is less favorable, because it fluctuates to a greater extent, as seen over the entire wafer. For the further method, a dielectric layer DS with a second topography corresponding to the profile line PL2 is used below.

A resist layer LS as polymer layer is then applied to the dielectric layer DS such that it forms a planar surface. For this purpose, a resist having a suitable viscosity is used and applied, in particular, by spin coating. The thickness of the resist layer is chosen to be high enough that the highest elevations of the second topography are smaller than the layer thickness of the resist layer LS. If appropriate, the resist layer is subsequently also cured thermally. FIG. 3 shows the arrangement at this method stage.

In the next step, the arrangement illustrated in FIG. 3 is subjected to an etching method. A method is chosen which enables a homogeneous layer removal over large areas. By way of example, reactive ion beam etching is well suited, wherein the etching atmosphere or the ion beam contains components suitable for removing the dielectric layer and simultaneously for removing the resist layer. For a dielectric layer comprising $SiO_2$, it is possible to use fluorine-containing substances, for example $CH_{4-x}F_x$ (x=1, 2, 3 or 4) or higher fluorocarbons. The etching of the resist layer LS can also be supported by oxygen in the etching atmosphere. The etching gas atmosphere is subsequently set such that identical etching rates for the resist layer and for the dielectric layer arise under the given etching conditions. The etching rate ratio can be set, for example, by way of varying the ratio of fluorine to oxygen in the etching atmosphere or by varying the substituent ratio C/F in a fluorine-containing compound.

A uniform layer removal is then performed by means of the reactive ion beam etching, wherein firstly exclusively the resist layer is etched until the surface of the elevations forming the second topography of the dielectric layer is uncovered. This is illustrated in FIG. 4A.

Figure 4B:
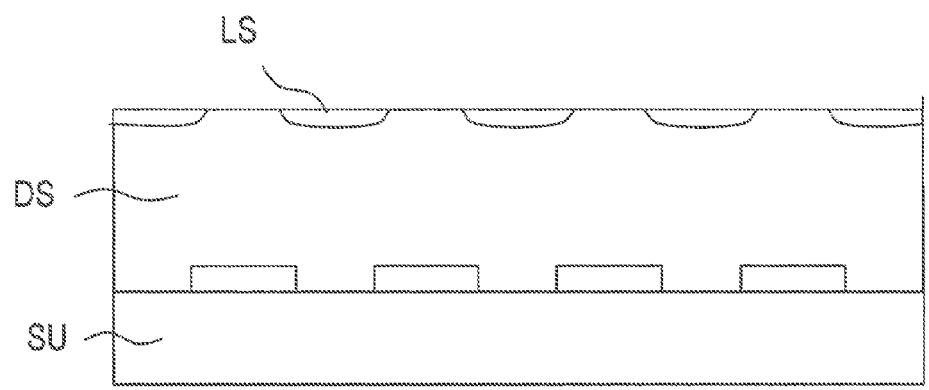

In the further course of etching, dielectric layer and resist layer are then etched at the same rate, such that the set planarity of the resist layer is obtained over the entire etching method. FIG. 4B shows the arrangement at a method stage wherein the surface has both uncovered regions of the dielectric layer and residues of the resist layer LS.

Figure 4C:
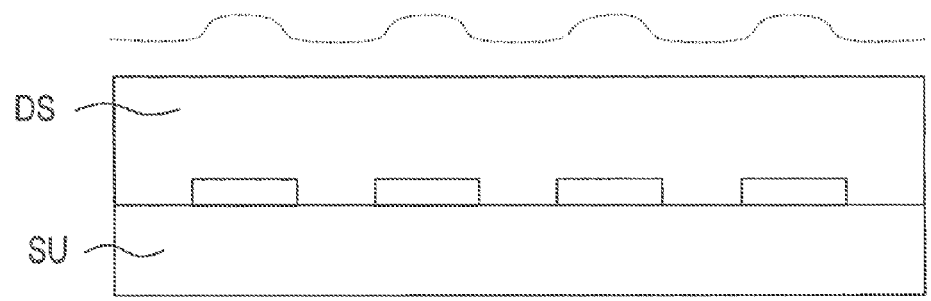

The etching is subsequently continued until at least the resist layer is completely removed and the dielectric layer DS having a planar surface remains, which constitutes the third topography. FIG. 4C shows the arrangement at this method stage. The dotted contour line represents the position (height) of the second topography and shows how far the etching method can be taken in comparison with the starting layer thickness. The dielectric layer has a layer thickness of 430 nm above the elevated structures ES, for example, and a layer thickness of approximately 530 nm between the elevated structures. Given a total height of the elevated structures of approximately 110 nm, this yields a minimum fluctuation of the layer thickness of +/−5 nm, which is within the scope of the tolerance and does not adversely impair the component properties of the SAW component. The thickness of the dielectric layer suffices to obtain a desired temperature compensation of the frequency for the SAW component. Although complete compensation is possible, it is normally optimized relative to a deterioration in other properties, e.g., a reduction in the coupling. The temperature compensation is accomplished by virtue of the fact that the propagation velocity of the acoustic wave in the dielectric layer DS, as the temperature rises, changes exactly oppositely to the propagation velocity of the acoustic wave in the piezoelectric substrate, which is a substrate composed of lithium niobate or lithium tantalate, for example. A layer thickness suitable for a desired temperature compensation is, moreover, also dependent on the center frequency of the component. The relative layer thickness in relation to the wavelength is a criterion for the achievable degree of temperature compensation.

With the planarization method, although a largely planar surface of the dielectric layer DS is obtained, the target layer thickness of the dielectric layer DS is not reliably achieved on account of the high layer thickness removed. Moreover, on account of inhomogeneities in the etching apparatus in a manner distributed over the wafer different etching rates can be established, which lead to a certain layer thickness distribution of the dielectric layer over one or more wafers. Other scattering mechanism can also lead locally to frequency deviations lying outside a desired tolerance.

The deviation of the layer thickness of the dielectric layer or generally the deviation of the frequency from a target value overall is then compensated for in a trimming method. In addition, the trimming method can also be used to compensate for fluctuations within the same wafer by virtue of the trimming method being carried out location-selectively and the layer thickness fluctuation at a desired location being set to a specific value.

In order to compensate for layer thickness fluctuations of the dielectric layer DS over the wafer and thus in order to compensate for component properties which are dependent on the layer thickness of the dielectric layer, firstly said component properties are determined at different locations of the wafer. The properties can be determined selectively at selected locations. The distribution of the component properties over the wafer surface can be determined from selected measurements by interpolation. From this distribution of the component properties, the deviation is then determined and the thickness of a trimming layer which is necessary for compensating for the deviation is calculated.

In a trimming method, as trimming layer TS an approximately 100 nm thick silicon nitride layer, for example, is applied, for example by a sputtering method or a CVD method. By means of reactive ion beam etching, the layer thickness of the trimming layer TS is then reduced until the residual layer thickness desired or calculated from the deviation is obtained. A suitable scanning program by which a desired scanning speed can be set in a location-dependent manner makes it possible to remove a desired layer thickness at each location of the wafer or to leave a desired residual layer thickness of the trimming layer and thus to compensate for the layer thickness fluctuations over the entire wafer. FIG. 5 shows the arrangement after the trimming layer TS has been applied. FIG. 6 shows the arrangement after a layer thickness region of the density $\Delta d$ has been etched away, thus leaving a residual trimming layer TS' of exactly the desired thickness which is necessary for compensating for the component property deviation.

In order to be able to compensate for all deviations with a single trimming layer and a single trimming method, as early as in the planarization method the thickness of the dielectric layer DS is set such that a thickening of the layer thickness or an increase in the frequency by means of a trimming layer that increases the wave propagation velocity is always required at each location.

In one embodiment, the layer thicknesses are dimensioned such that the trimming layer TS' can remain on average with a target layer thickness of approximately 40 nm on the surface of the dielectric layer DS. With this layer thickness, the trimming layer simultaneously fulfills the function of a passivation layer, such that the dielectric layer (here the silicon dioxide layer) is protected e.g., against absorption of moisture, which would otherwise lead to a further shift in the center frequency. In this way, it is ensured that the resonant frequency or the center frequency of the component remains stable both with respect to temperature fluctuations and with respect to environmental conditions, in particular with respect to moisture.

The diagram according to FIG. 7 illustrates how the center frequency of the component can be shifted by applying a trimming layer of varying thickness. The values determined for a trimming layer composed of silicon nitride show that a frequency shift by approximately 9000 ppm can be achieved with a trimming layer having a thickness of approximately 45 nm. This shift suffices to compensate for production-governed fluctuations in the center frequency with a trimming layer having a maximum thickness of approximately 50 nm.

Figure 8A:
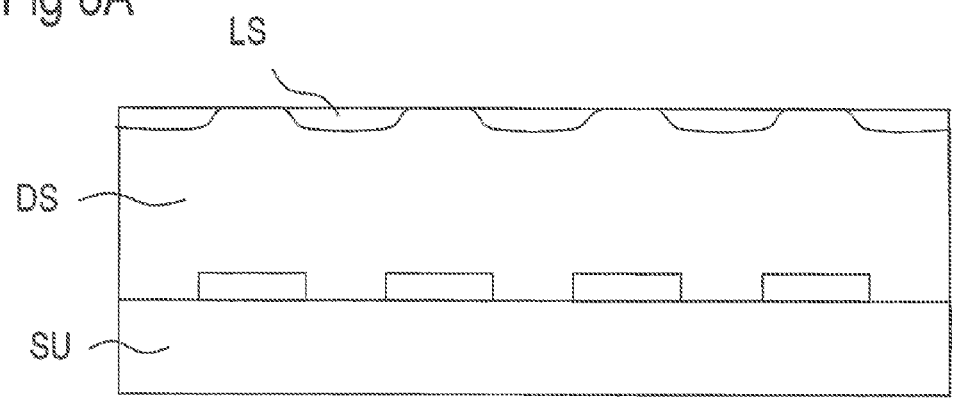
FIGS. 8a to 8c show different method stages when etching back the polymer layer with an etching rate ratio>1.
Figure 8B:
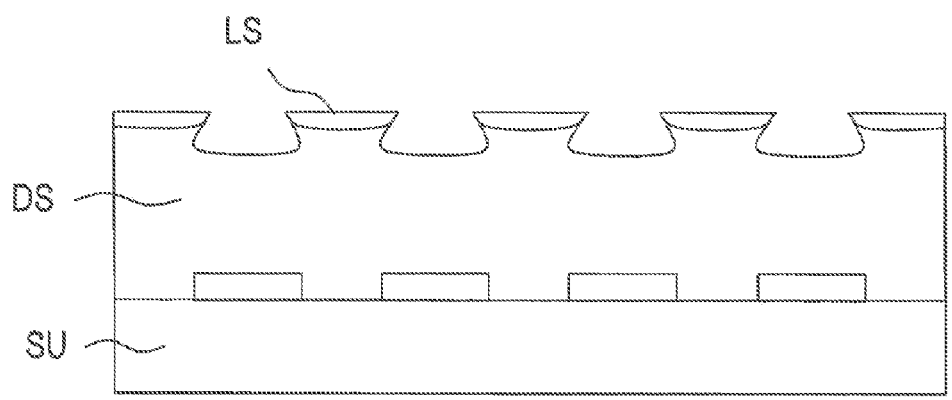
Figure 8C:
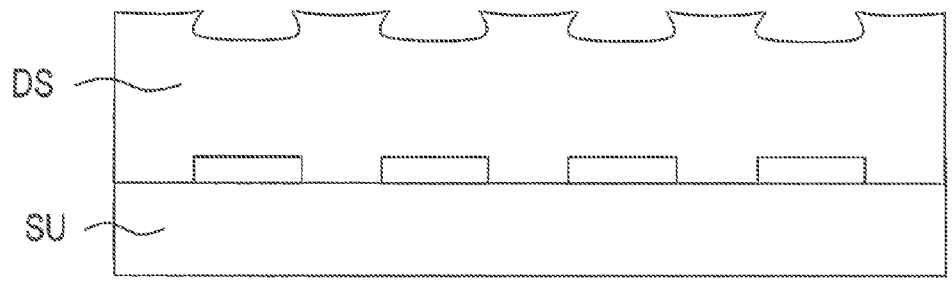

FIGS. 8A to 8C show a variant of the method as to how a third topography—deviating from planarity—of the dielectric layer DS can be obtained when etching back the dielectric layer with an etching rate ratio>1. FIG. 8A shows the arrangement during the etching method at the stage at which the surface of the dielectric layer DS has just been uncovered. Regions of the dielectric layer DS having a smaller layer thickness are covered with the resist layer LS. As a result of the etching rate ratio>1, the material of the dielectric layer DS is then preferably etched, wherein the regions covered with resist layer LS serve as an etching mask. FIG. 8B shows the arrangement after corresponding depressions have been produced in the dielectric layer DS. In a final step, residues of the resist layer LS that still remained are removed, the structure shown in FIG. 8C being obtained.

By means of the method specified, dielectric layers for different applications can be provided with a suitable topography. In addition, the method makes it possible to produce planar surfaces, in particular, and to compensate for deviations from a desired layer thickness both over the batch and over the individual wafer by means of a suitable trimming method. In this way, it is possible to obtain components whose component properties dependent on the layer thickness of the dielectric layer can be set with high constancy over different batches and over the surface of the wafer.

The invention claimed is:

1. A method for producing a dielectric layer on a surface of a component, the surface having a first topography with elevated structures, the method comprising:

forming a dielectric layer over the structures over an entire area of the first topography, such that the surface of the dielectric layer has a second topography, wherein forming the dielectric layer comprises forming a silicon dioxide layer, wherein the component comprises a piezoelectric layer on a substrate or a piezoelectric substrate and also comprises an electrode structure disposed above a surface of the substrate that forms the first topography, the electrode structure is configured to excite acoustic waves in the component, wherein the dielectric layer is in direct contact with the structures and encapsulates all exposed surfaces of all the structures across the substrate, forming a polymer layer having a planar surface over the dielectric layer over the entire area, performing an etching method, wherein a desired etching rate ratio of dielectric layer to resist layer is set, continuing the etching method until a surface of the dielectric layer has a desired third topography after complete removal of the resist layer;

forming a trimming layer having a higher stiffness than a stiffness of the dielectric layer, the trimming layer formed on the dielectric layer over the third topography; and reducing a thickness of the trimming layer until a predefined center frequency of the combined dielectric layer and trimming layer is attained.

2. The method according to claim 1, wherein forming the dielectric layer comprises performing a deposition process.

3. The method according to claim 1, wherein a temperature dependence of a frequency of the component is reduced with the dielectric layer.

4. The method according to claim 1, wherein all of the method steps are carried out on a wafer on which electrode structures of a plurality of components are arranged, wherein a center frequency of individual components is determined at a method stage between producing the third topography and etching back the trimming layer, wherein the center frequency of individual components is determined from selected measurements by interpolation, wherein a distribution of deviations from a desired center frequency is determined, and wherein the thickness of the trimming layer is reduced location-selectively in a manner dependent on the deviation determined at a respective location, such that the deviations are leveled and the center frequencies of all of the components are set to a desired value within a tolerance.

5. The method according to claim 1, wherein the trimming layer comprises a layer comprising a material selected from the group consisting of silicon nitride, silicon oxynitride, aluminum oxide, diamond like carbon and diamond.

6. The method according to claim 4, wherein a thickness of the trimming layer is reduced by a scanning action of an ion beam on the surface of the trimming layer.

7. The method according to claim 6, wherein a desired change in the center frequency at a specific location is effected by a corresponding exposure time relative to the ion beam at this specific location, wherein the exposure time is set by way of a respective speed at which the wafer is guided past below the ion beam at the respective specific location.

8. The method according to claim 1, wherein the etching rate ratio is set to a value of about 1.

9. The method according to claim 1, wherein a substantially planar surface of a remaining dielectric layer is obtained as second topography.

10. The method according to claim 1, wherein the etching rate ratio is set to a value of greater than 1.

11. The method according to claim 10, wherein a remaining dielectric layer obtains a second topography which is the inverse of the first topography and which has depressions above the elevated structures of the first topography.

12. The method according to claim 1, wherein the etching rate ratio is set to a value of less than 1.

13. The method according to claim 12, wherein the structures of the second topography are partly leveled.

* * * * *